(12) United States Patent  (10) Patent No.: US 6,725,170 B1
Hickman  (45) Date of Patent: Apr. 20, 2004

(54) SMART PROBE APPARATUS AND METHOD FOR AUTOMATIC SELF-ADJUSTMENT OF AN OSCILLOSCOPE'S BANDWIDTH

(75) Inventor: Barton T. Hickman, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 92 days.

(21) Appl. No.: 09/718,718

(22) Filed: Nov. 22, 2000

(51) Int. Cl.$^7$ ............................................... G01R 35/00
(52) U.S. Cl. ........................ 702/106; 702/91; 702/104; 324/72.5
(58) Field of Search ...................... 702/57, 64, 66–68, 702/70, 71, 73–76, 79, 80, 85, 90, 91, 104, 106, 107, 116, 124–126, 183, 187, 189; 324/72.5, 97, 121 R

(56) References Cited

U.S. PATENT DOCUMENTS

| | | | | |
|---|---|---|---|---|
| 4,070,615 A | * | 1/1978 | Crop | 324/601 |
| 4,608,532 A | | 8/1986 | Ibar et al. | |
| 4,672,306 A | * | 6/1987 | Thong | 324/72.5 |
| 5,691,635 A | * | 11/1997 | Pot et al. | 324/115 |
| 5,978,742 A | * | 11/1999 | Pickerd | 324/121 R |
| 6,321,171 B1 | * | 11/2001 | Baker | 702/104 |
| 6,351,112 B1 | * | 2/2002 | Felps et al. | 324/72.5 |

FOREIGN PATENT DOCUMENTS

EP  0984287 A  3/2000

* cited by examiner

Primary Examiner—Marc S. Hoff
Assistant Examiner—Manuel L Barbe
(74) Attorney, Agent, or Firm—James G. Stuart; Thomas F. Lenihan; William K. Bucher

(57) ABSTRACT

The invention involves storing information about the probe frequency response in the probe itself. The information preferably consists of a set of one or more characteristic frequency response data points. Each data point includes at least the gain of the probe at a given frequency. More preferably, each data point includes the complex transfer characteristic of a probe (S21 in FIG. 2) and optionally the complex output reflectivity of the probe (S22 in FIG. 2) and the frequency (F in FIG. 2) at which the data applies. A variable number of frequency points can be stored, as necessary, to adequately describe the probe's response. The probe also preferably stores a header containing the number of stored data points. The invention readily extends to probes having multiple gain settings or multiple bandwidth settings, by simply storing multiple sets of S21, S22 and F data. When the probe is attached to a scope, the scope reads the frequency response information from the probe in accordance with any suitable communications format and protocol. Using information about its own frequency response and input voltage standing wave ratio (VSWR), the scope undertakes to adjust its frequency response (by which is meant to add or subtract gain at high frequency), thereby compensating for the frequency response of the probe and optimizing overall system frequency response.

14 Claims, 3 Drawing Sheets

SMART PROBE APPARATUS AND METHOD FOR AUTOMATIC SELF-ADJUSTMENT OF AN OSCILLOSCOPE'S BANDWIDTH

BACKGROUND OF THE INVENTION

The present invention relates generally to smart probe apparatus for use with oscilloscopes (scopes), and more particularly to probe and a process for automatic self-adjustment of a scope's bandwidth based on knowledge of the connected probe's communicated bandwidth.

It is difficult to optimize a probe and scope to operate together. Often times a scope will be designed with a certain −3 dB bandwidth and a probe is designed to be used with that scope. If the probe has the same −3 dB bandwidth then when it is attached to the scope, the system including both the scope and an attached probe will have a bandwidth at the probe tip possibly quite a bit lower than either component separately.

This represents a problem for the user since the bandwidth to the probe tip is often not known. A common solution is to design the probe to be peaked such that it will be 0 dB at the scope's bandwidth so when it is attached to the scope the whole system still has the same bandwidth as the scope by itself. Adjusting the probe's transient and frequency response to be optimum with a particular scope may not well suit the probe to other oscilloscopes—particularly future models not yet designed. For example, plugging the probe into a future higher speed scope may result in an underdamped transient response since the probe was designed assuming the slower scope's front-end to dampen the response. Another solution would be to under-damp the scope's transient response so it has enough margin at its bandwidth to guarantee a particular system bandwidth with the probe attached. A problem then arises, however, that involves sacrificing settling time and noise performance when a particular probe is not being used.

SUMMARY OF THE INVENTION

This invention takes advantage of the fact that the front-end of an oscilloscope normally has excess HF adjustment range (or it can be designed to have such) that can be used to peak the frequency response of the scope automatically as needed to obtain optimum system response. It also makes use of probes/scopes utilizing the TekConnect Probe Interface available from Tektronix, Inc. of Beaverton, Oreg., assignee of the present invention. The TekConnect Probe Interface, in turn, utilizes the so-called I²C bus, familiarity with which is assumed.

The I²C bus is described and illustrated in U.S. Pat. No. 4,689,740 entitled TWO-WIRE BUS-SYSTEM COMPRISING A CLOCK WIRE AND A DATA WIRE FOR INTERCONNECTING A NUMBER OF STATIONS, issued Aug. 25, 1987 and assigned to U.S. Phillips Corporation. See also U.S. Pat. No. 4,672,306 entitled ELECTRONIC PROBE HAVING AUTOMATIC READOUT OF IDENTIFICATION AND STATUS, issued Jun. 9, 1987 and assigned in common with the present invention. These two patent disclosures are incorporated herein by this reference.

Briefly, the invention involves storing information about the probe frequency response in the probe itself. The information preferably consists of a set of one or more characteristic frequency response data points. Each data point includes at least the gain of the probe at a given frequency. More preferably, each data point includes the complex transfer characteristic of a probe (S21 in FIG. 2) and optionally the complex output reflectivity of the probe (S22 in FIG. 2) and the frequency (F in FIG. 2) at which the data applies. A variable number of frequency points can be stored, as necessary, to adequately describe the probe's response. The probe also preferably stores a header containing the number of stored data points. The invention readily extends to probes having multiple gain settings or multiple bandwidth settings, by simply storing multiple sets of S21, S22 and F data.

When the probe is attached to a scope, the scope reads the frequency response information from the probe in accordance with any suitable communications format and protocol. Using information about its own frequency response and input voltage standing wave ratio (VSWR), the scope undertakes to peak its frequency response (by which is meant to add more gain at high frequency), thereby compensating for the frequency response of the probe.

DETAILED DESCRIPTION OF THE INVENTION

Figure 1:
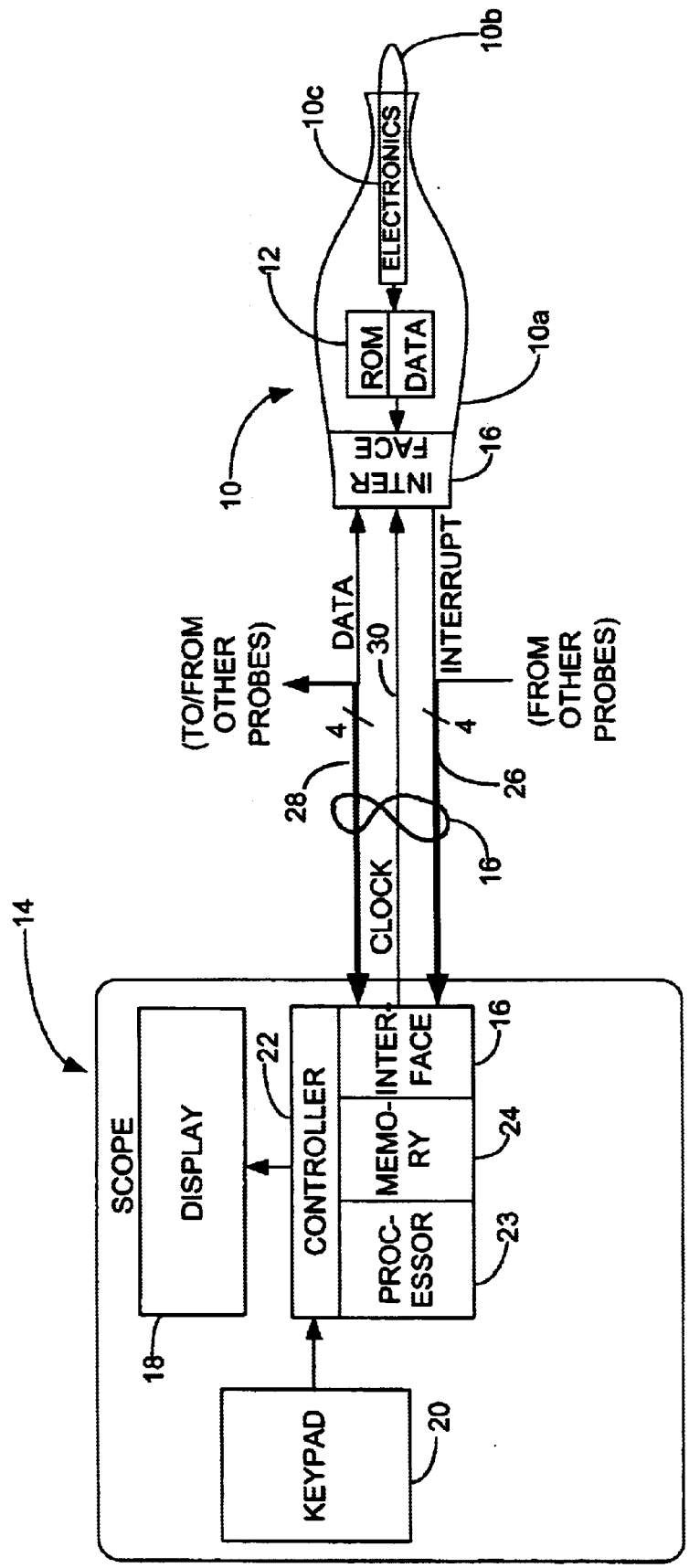
FIG. 1 is a detailed schematic diagram of a probe apparatus made in accordance with the present invention, the smart probe being connected to a scope.

In accordance with one embodiment of the invention presently preferred because of its straightforward implementation, the invented smart probe 10 stores a single datum, e.g. its gain A at a given frequency (or, in the most straightforward implementation, simply its bandwidth), in a read-only memory (ROM) 12 within a probe housing 10a. Upon power-up of probe 10 (e.g. upon its attachment to a scope 14), probe 10 communicates the datum to the connected scope 14 over a bit-serial synchronous interface 16. Scope 14 assumes based upon a bandwidth datum between approximately 3 GHz and 5 GHz that the represented bandwidth defines the connected probe's −2 db gain and adjusts its bandwidth in accordance with the bandwidth datum from probe 10.

For example, a give probe 10 may simply store its own 4 GHz bandwidth datum in ROM 12. When the scope's controller reads the datum from ROM 12, it determines that the bandwidth of the connected 4 GHz probe is between 3.5 GHz and 5 GHz. In response to the datum read from the connected probe's ROM, the scope's controller boosts its HR gain by +2 db, a gain empirically determined (from testing a large population of probes) best to compensate for the 4 GHz probe's characteristic frequency response. Thus, the invention contemplates automatically optimizing system bandwidth each time a probe is attached to a scope.

Those of skill in the art will appreciate that interface 16, in accordance with a preferred embodiment of the invention, includes four identical bit-serial channels. Thus, scope 14 with interface 16 operatively coupled thereto can support as many as four probes like probe 10. Those of skill in the art also will appreciate that, not shown in FIG. 1, is the analog coaxial probe input signal line being monitored and optionally displayed by scope 14. Such a conventional display is indicated at 18, along with a keypad 20 for user input. It will be appreciated that scope 14 optionally may communicate the characteristic frequency response of connected probe 10 to the user, e.g. on display 18. Scope 14 may be seen to include a controller 22 having a processor 23 and a memory 24, as is conventional. The novel aspects of controller 22 will be described in more detail below.

When probe 10 is connected to scope 14, probe 10 asserts an interrupt on an interrupt signal line 26 that forms part of interface 16. Controller 22 in response to the asserted interrupt then queries probe 10 via interface 16 to determine whether probe 10 includes a machine-readable memory, e.g. ROM 12. Probe 10 responds to the query by identifying itself as a probe having such a memory. Such query-response sequence may be in accordance with any suitable predefined protocol, and preferably is communicated over a bi-directional, bit-serial data channel 28 in synchronization with a clock signal 30. Then controller 22 reads the stored characteristic frequency response data from the specified address(es) within ROM 12 over the same synchronous, bit-serial data channel 28 and stores the data in its own memory 24.

It will be appreciated that also stored in memory 24 is the scope's own frequency response data. Based upon the probe's frequency response characteristics and its own frequency response characteristics, controller 22 automatically adjusts the scope's own frequency response to compensate for the characteristic frequency response of probe 10, i.e. of probe tip 10b and its associated electronics 10c. Such adjustment may involve peaking scope 14, which will be understood to include boosting the scope's highfrequency gain by a defined amount, e.g. by +1 db or more. Those of skill in the art will appreciate that the adjustment may alternatively involve adjusting the scope's HF gain down instead of up. Such adjustment, whether up or down, may be performed by any suitable technique, as by taking advantage of the excess HF adjustment range that is known to characterize conventional scopes.

Figure 2:
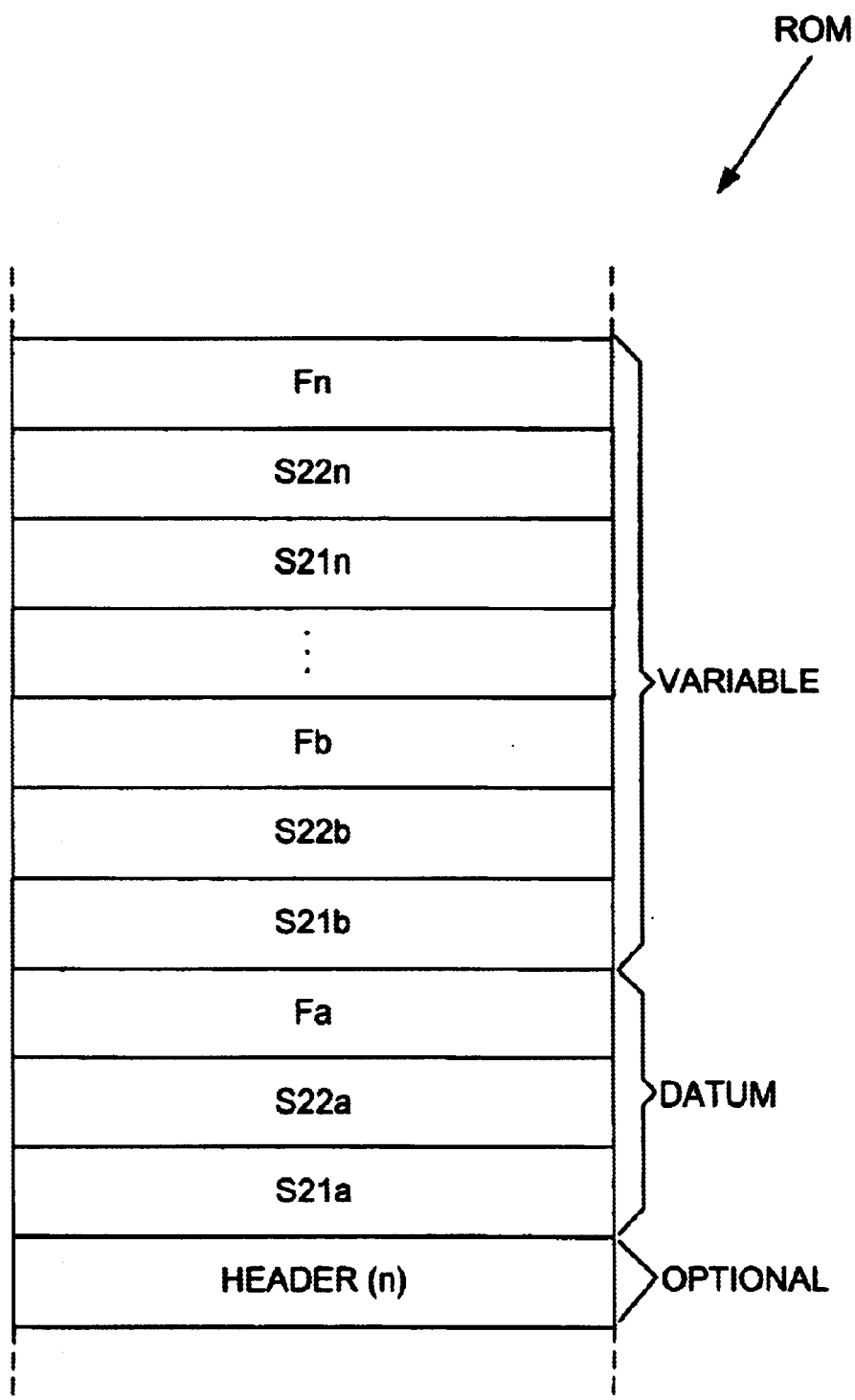
FIG. 2 is a block diagram of the data format in which probe frequency response information can be stored in the memory shown in FIG. 1 in accordance with one embodiment of the invention.

FIG. 2 illustrates a preferred data storage structure in a section of ROM 12 that is capable of supporting plural data points, wherein all of the plural data points taken collectively describe the frequency response characteristic of probe 10. Those of skill in the art will appreciate that any suitable data structure is possible, within the spirit and scope of the invention. FIG. 2 shows that each of n probe data sets preferably includes a complex transfer characteristic datum $S21_a$, a complex output reflectivity datum $S22_a$ and a frequency $F_a$ at which the $S21_a$ and $S22_a$ data apply. FIG. 2 shows inclusion of n such data entries, each designated by a letter subscript, and those of skill in the art will appreciate that n may be any desired integer.

Figure 3:
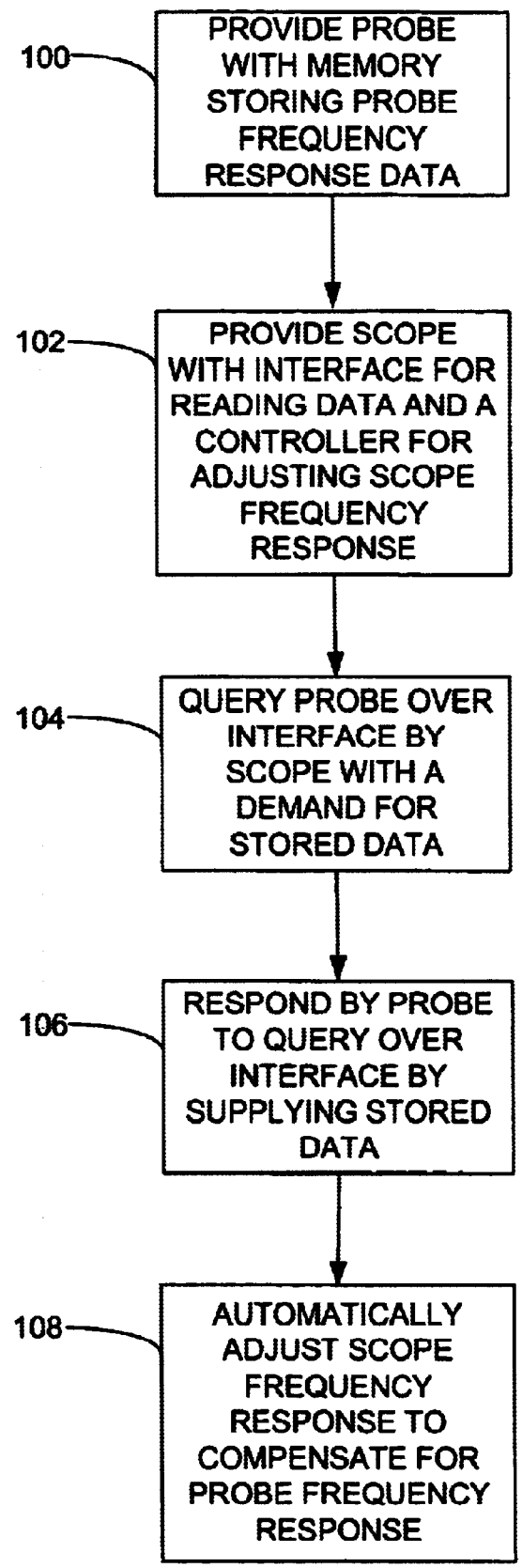
FIG. 3 is a flowchart illustrating the preferred method of the invention.

FIG. 3 is a flowchart that illustrates the preferred method of the invention by which a scope's frequency response is adjusted automatically to adapt to a connected probe. The invented method includes providing a probe with a memory, e.g. a ROM, storing in processor-readable form predefined data descriptive at least of the frequency response that characterizes the probe tip and its associated electronics. This step is illustrated in FIG. 3 at 100. The method further includes providing the scope with a) an interface capable, upon connection of the probe to the scope, of reading the predefined data from the memory and b) a controller capable of adjusting the scope's frequency response. This step is illustrated in FIG. 3 at 102.

In accordance with the preferred method of the invention, the scope queries the probe over the interface with a demand for data and the probe responds over the interface to the demand by supplying data stored in a memory device within the probe. These steps are illustrated in FIG. 3 at 104 and 106. Finally, the method includes automatically adjusting the scope's frequency response to compensate for the probe's characteristic frequency response, whereby the scope and the probe when connected are characterized by a predefined overall system frequency response. This step is illustrated in FIG. 3 at 108.

Benefits of the invention include:

1) The scope can be adjusted directly to −3 dB at its specified bandwidth when there is no probe being used. This optimizes distortion, transient response, and noise performance. When a probe is attached, only the necessary amount of peaking is added to maintain system bandwidth while still maintaining an optimum transient response.
2) If a probe much slower than the scope is used, the scope can decide to lower its bandwidth as much as possible to minimize noise that would otherwise result from such a mismatch.
3) Whether the scope compensates for the probe or not, the scope knows the system bandwidth with the probe attached, and can communicate this number to the user, e.g. via a visual display associated with the scope or networked computer screen, or any other suitable means including an audible signal or a printout.
4) Because of the consistent format, but general nature, of the information stored in the probe, any future scopes may be designed to work with present-day probes and any present-day scopes will work with future probes.

Finally, those of skill in the art will appreciate that the invented method and apparatus described and illustrated herein may be implemented in software, firmware or hardware, or any suitable combination thereof. Preferably, the method and apparatus are implemented in software, for purposes of low cost and flexibility. Thus, those of skill in the art will appreciate that the method and apparatus of the invention may be implemented by a computer or microprocessor process in which instructions are executed, the instructions being stored for execution on a computer-readable medium and being executed by any suitable instruction processor. Alternative embodiments are contemplated, however, and are within the spirit and scope of the invention.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

What is claimed is:

1. Smart probe apparatus, for use with an oscilloscope, the probe comprising:
    a housing mounting a probe tip and associated electronics having a characteristic frequency response;
    a first memory within said housing, said first memory storing in processor-readable form predefined data descriptive at least of such characteristic frequency response wherein said predefined data includes plural data points, each of said plural data points representing the frequency response of said probe tip and associated electronics at defined frequencies along a frequency spectrum; and
    an interface between said first memory and the oscilloscope, said first memory in response to mating of said probe with an oscilloscope communicating said predefined data to the oscilloscope over said interface.

2. The probe apparatus of claim 1, wherein said first memory is a read-only memory (ROM).

3. The probe apparatus of claim 1, wherein said first memory further stores in processor-readable form a header containing at least the number of said plural data points stored in said first memory and wherein said first memory further communicates said header over said interface to the oscilloscope prior to communicating said predefined data over said interface.

4. The probe apparatus of claim 3, wherein said first memory is a read-only memory (ROM).

5. The probe apparatus of claim 1, wherein said interface is synchronous and includes a clock signal line.

6. The probe apparatus of claim 5, wherein said interface includes plural data signal lines corresponding to plural connected probes.

7. The probe apparatus of claim 5, wherein said interface includes plural interrupt signal lines, each of said plural interrupt signal lines corresponding with one of said plural data lines.

8. The probe apparatus of claim 5, wherein said interface includes an interrupt signal line.

9. The probe apparatus of claim 1 in which said probe tip and associated electronics further have a complex transfer characteristic and a complex output reflectivity, wherein said predefined data are further descriptive of such complex transfer characteristic and of such complex output reflectivity.

10. The probe apparatus of claim 1 which further comprises:

a controller within the oscilloscope, said controller including a processor and a second memory, said processor in response to mating of said probe with the oscilloscope receiving said predefined data communicated over said interface and storing the same in said second memory.

11. The probe apparatus of claim 10 in which said controller, after receiving and storing said communicated predefined data, communicates the oscilloscope's frequency response to a user thereof.

12. The probe apparatus of claim 11, wherein said controller communicates to the user via a visual display.

13. The probe apparatus of claim 10 in which said probe tip and associated electronics further have a complex transfer characteristic and a complex output reflectivity, wherein said predefined data are further descriptive of such complex transfer characteristic and of such complex output reflectivity.

14. The probe apparatus of claim 10 in which said controller, after receiving and storing said communicated predefined data, adjusts the oscilloscope's frequency response to compensate for the characteristic frequency response of said probe tip and associated electronics.

* * * * *